US010729006B2

(12) United States Patent
Nasu et al.

(10) Patent No.: US 10,729,006 B2
(45) Date of Patent: *Jul. 28, 2020

(54) WIRING SUBSTRATE FOR ELECTRONIC COMPONENT INSPECTION APPARATUS

(71) Applicant: NGK SPARK PLUG CO., LTD., Nagoya, Aichi (JP)

(72) Inventors: Takakuni Nasu, Komaki (JP); Yousuke Kondo, Nagoya (JP); Kouta Kimata, Nagoya (JP); Guangzhu Jin, Inuyama (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 114 days.

This patent is subject to a terminal disclaimer.

(21) Appl. No.: 16/125,906

(22) Filed: Sep. 10, 2018

(65) Prior Publication Data
US 2019/0082531 A1 Mar. 14, 2019

(30) Foreign Application Priority Data

Sep. 12, 2017 (JP) .................................. 2017-174426

(51) Int. Cl.
*H01L 23/48* (2006.01)
*H05K 1/02* (2006.01)
(Continued)

(52) U.S. Cl.
CPC ....... *H05K 1/0268* (2013.01); *G01R 1/07314* (2013.01); *G01R 3/00* (2013.01);
(Continued)

(58) Field of Classification Search
CPC ............. H01L 21/02118; H01L 21/022; H01L 25/043; H05K 1/0268; H05K 1/0271;
(Continued)

(56) References Cited

U.S. PATENT DOCUMENTS

2016/0323996 A1  11/2016 Takemura
2019/0098769 A1* 3/2019 Nasu .................... H05K 3/4626
2019/0098770 A1* 3/2019 Nasu .................... H05K 1/0306

FOREIGN PATENT DOCUMENTS

JP    2011-165945 A    8/2011
JP    2015-025812 A    2/2015
WO    2015-108051 A1   7/2015

OTHER PUBLICATIONS

Korean Intellectual Property Office, Office Action (Notification of Reason for Refusal) issued in corresponding Application No. 10-2018-0107810, dated Feb. 25, 2020.

* cited by examiner

*Primary Examiner* — Brook Kebede
(74) *Attorney, Agent, or Firm* — Stites & Harbison, PLLC; Jeffrey A. Haeberlin; Gary N. Stewart

(57) ABSTRACT

[Objective] To provide a wiring substrate for electronic component inspection apparatus which includes a first laminate of resin layers with a plurality of pads for probe provided on its front surface and a second laminate of ceramic layers disposed on the back side of the first laminate and which, despite joining by brazing of a plurality of studs to the back surface of the second laminate, is free from deformation of resin of the first laminate caused by softening or the like and from accidental formation of a short circuit between brazing material layers used for the brazing and external connection terminals formed on the back surface of the second laminate.
[Means for Solution] A wiring substrate for electronic component inspection apparatus 1 which includes a first laminate 3 composed of a plurality of stacked resin layers j1 to j3 and having a plurality of pads for probe 9 on its front surface 5, a second laminate 4 disposed on a back surface 6 side of the first laminate 3 and composed of a plurality of stacked
(Continued)

ceramic layers c1 to c3, and a plurality of studs 20*a* joined to a back surface 8 of the second laminate 4 and in which the resin layers j1 to j3 of the first laminate 3 are formed of a resin having a thermal deformation temperature of 300° C. or higher, and the studs 20*a* are joined to surfaces of metal layers 16 formed on the back surface 8 of the second laminate 4 via brazing material layers 28, respectively.

7 Claims, 2 Drawing Sheets

(51) Int. Cl.
*G01R 31/28* (2006.01)
*H01L 25/04* (2014.01)
*H01L 21/02* (2006.01)
*H05K 13/08* (2006.01)
*G01R 3/00* (2006.01)
*H05K 3/46* (2006.01)
*G01R 1/073* (2006.01)

(52) U.S. Cl.
CPC ..... *G01R 31/2851* (2013.01); *G01R 31/2886* (2013.01); *G01R 31/2889* (2013.01); *H01L 21/022* (2013.01); *H01L 21/02118* (2013.01); *H01L 25/043* (2013.01); *H05K 1/0271* (2013.01); *H05K 3/4605* (2013.01); *H05K 13/082* (2018.08)

(58) Field of Classification Search
CPC ............... H05K 3/4605; H05K 13/082; G01R 1/07314; G01R 3/00; G01R 31/2851; G01R 31/2886; G01R 31/2889
USPC ........................................................ 257/734
See application file for complete search history.

WIRING SUBSTRATE FOR ELECTRONIC COMPONENT INSPECTION APPARATUS

TECHNICAL FIELD

The present invention relates to a wiring substrate for use in an electronic component inspection apparatus for inspecting electrical characteristics of a large number of electronic components, for example, semiconductor devices, formed along the surface of a silicon wafer.

BACKGROUND ART

In order to adjust the posture of the wiring substrate in the inspection apparatus for bringing a plurality of probe pins into uniform and individual contact with the large number of electronic components, the wiring substrate has studs, each having a bolt, joined to its back surface opposite its front surface having pads for probe into which the probe pins are to be implanted, in such a manner that the bolts become perpendicular to the back surface. For example, regarding the case where via conductors (conductors for connection between adjacent layers) are located on the back surface to which the studs are joined, at positions around the studs, in order for the substrate to be less susceptible to occurrence of cracking in the vicinity of the via conductors even in the event of application of a large external force to the studs, there have been proposed a multilayer ceramic substrate for which various dimensions such as the distance between the center axis of the via conductor and the circumcircle of a brazing material layer used to join the stud to a surface metal layer formed on the back surface are specified as appropriate, as well as a method of manufacturing the multilayer ceramic substrate (see, for example, Patent Document 1).

However, the multilayer ceramic substrate and the method of manufacturing the same have involved the following potential problem in an attempt to meet a request for implementation of fine pitch: a short circuit may be accidentally formed between an external connection terminal connected to the back surface of the via conductor and the circumcircle (outer circumferential edge) of the brazing material layer used to join the stud to the surface metal layer formed on the back surface of the substrate.

Also, the use of a resin adhesive for joining the stud has involved the following potential problem: since the length of protrusion of the resin adhesive from the stud cannot be sufficiently controlled, the protruding resin adhesive may possibly cover a portion of the external connection terminal, potentially resulting in a failure to electrically connect the external connection terminal to an external electrode or the like.

Further, in the case where the wiring substrate for electronic component inspection apparatus has a structure in which a plurality of resin insulation layers are laminated with a plurality of pads for probe provided on the front surface of the laminate, and a plurality of ceramic layers are laminated on the back side of the laminate of the resin insulation layers, the following potential problem has been involved: when the studs are joined by brazing to respective metal layers provided on the back surface of the outermost ceramic layer, resin of the resin insulation layers may possibly deform as a result of softening or melting.

PRIOR ART DOCUMENT

Patent Document

[Patent Document 1] Japanese Patent Application Laid-Open (kokai) No. 2011-165945 (pages 1 to 20, FIGS. 1 to 7)

SUMMARY OF THE INVENTION

Problem to be Solved by the Invention

An object of the present invention is to solve the problems described above in the section Background Art and to provide a wiring substrate for electronic component inspection apparatus which includes a first laminate of resin layers with a plurality of pads for probe provided on its front surface and a second laminate of ceramic layers disposed on the back side of the first laminate; which, despite joining by brazing of a plurality of studs to the back surface of the second laminate, is free from deformation of resin of the first laminate caused by softening or the like and from accidental formation of a short circuit between brazing material layers used for the brazing and external connection terminals formed on the back surface of the second laminate; and which is less susceptible to disconnection from an external device, which could otherwise result from covering of the external connection terminal(s) by a resin adhesive.

Means for Solving the Problem and Effect of the Invention

In order to solve the above problem, the present invention has been conceived according to the following idea: the studs are joined respectively to the surfaces of metal layers formed on the back surface of the second laminate via respective brazing material layers, and a resin having a thermal deformation temperature of 300° C. or higher is used for forming the resin layers of the first laminate.

Specifically, a wiring substrate for electronic component inspection apparatus of the present invention (claim 1) comprises a first laminate which is composed of a plurality of stacked resin layers and which has a plurality of pads for probe on its front surface, a second laminate which is disposed on a back surface side of the first laminate and which is composed of a plurality of stacked ceramic layers, and a plurality of studs joined to a back surface of the second laminate, and is characterized in that the resin layers of the first laminate are formed of a resin having a thermal deformation temperature of 300° C. or higher, and the stud is joined via a brazing material layer to a surface of a metal layer formed on the back surface of the second laminate.

The wiring substrate for electronic component inspection apparatus yields the following effect (1).

(1) Since a resin used to form the resin layers of the first laminate has a thermal deformation temperature of 300° C. or higher, and the stud is joined via the brazing material layer to the surface of the metal layer formed on the back surface of the second laminate, even when the studs are brazed by means of the brazing material at a brazing temperature of 300° C. or higher, the resin layers of the first laminate are free from deformation caused by softening or melting, so that the wiring substrate exhibits excellent accuracy in shape and dimension.

Later, probe pins are provided individually on the pads for probe in a standing manner.

Also, the ceramic layers of the second laminate are formed of a low-temperature-firing ceramic, such as glass-ceramic.

Further, inner wiring layers and via conductors are formed as appropriate in the first laminate and the second laminate in a mutually electrically communicating manner. The inner wiring layers and via conductors are formed of copper or a copper alloy, or silver or a silver alloy. However, the inner wiring layers and via conductors formed in the second laminate may assume the form of metallization layers which contain tungsten or molybdenum.

Also, the metal layer is formed, for example, by sequentially laminating a thin film layer of titanium formed by sputtering, a thin film layer of copper formed by sputtering, a plating film of copper, and a plating film of nickel.

Further, the brazing material layer is supplied in a molten state onto the surface of the metal layer or the joint surface of the flange portion of the stud; alternatively, a brazing material preform having a shape similar to the external shape of the flange portion of the stud in plan view is disposed.

Also, the stud is formed of, for example, Kovar (Fe-29% Ni-17% Co), 42 alloy (Fe-42% Ni), 194 alloy (Cu-2.3% Fe-0.03% P), or various types of stainless steel.

Additionally, externally exposed surfaces of the metal layer, the post-joining brazing material layer, and the stud are electroplated with, for example, a gold film via a nickel film.

Also, the present invention encompasses a wiring substrate for electronic component inspection apparatus wherein the brazing material layer has an extension portion located, in plan view, within a range of a distance between an outermost portion of the brazing material layer and a peripheral edge of a joint surface of the stud, and a length of the extension portion is 50 μm or less in the plan view (claim 2).

The wiring substrate for electronic component inspection apparatus yields the following effect (2).

(2) Even though a plurality of the studs and a plurality of the connection terminals are disposed at high density on the back surface of the second laminate, since the length of the extension portion of the brazing material layer used for joining of each stud is 50 μm or less from the joint surface of the stud in the plan view, there can be restrained accidental formation of a short circuit between the adjacent studs or between the studs and the external connection terminals.

Further, the present invention encompasses a wiring substrate for electronic component inspection apparatus wherein a plurality of the brazing material layers used for joining of the plurality of studs have the extension portions, respectively, and a standard deviation σ indicative of the amount of variation of the extension portions in the plan view is 30 μm or less (claim 3).

The wiring substrate for electronic component inspection apparatus can more reliably yield the effect (2), since the extension portions of the brazing material layers used for joining of a plurality of the studs exhibit a standard deviation σ of 30 μm or less.

Also, the present invention encompasses a wiring substrate for electronic component inspection apparatus wherein the stud comprises a flange portion having the joint surface facing the metal layer, and a bolt portion standing perpendicularly from a surface of the flange portion, or a nut tube portion standing perpendicularly from the surface of the flange portion (claim 4).

The wiring substrate for electronic component inspection apparatus yields the following effect (3).

(3) By means of stud-by-stud adjustment of nuts or bolts of an inspection apparatus threadingly engaged with external threads of the bolt portions or internal threads of the nut tube portions, probe pins implanted in the upper surfaces of the pads for probe can be reliably brought into contact with a large number of electronic components, respectively, to be inspected, whereby the electronic components can be accurately inspected.

Meanwhile, the flange portion of the stud is, for example, a flat plate having a uniform thickness of about 2 mm to 7 mm and has a circular shape (the diameter is, for example, 10 mm to 14 mm) in a bottom view. The shape in the bottom view may be of a regular polygon equal to or greater than a regular hexagon in terms of number of sides.

Also, the nominal size of the external thread of the bolt portion of the stud or the internal thread of the nut tube portion of the stud is, for example, M4 or M5.

Further, the present invention encompasses a wiring substrate for electronic component inspection apparatus wherein the stud is joined such that the flange portion of the stud is joined to the surface of the metal layer formed on the back surface of the second laminate via the brazing material layer (claim 5).

The wiring substrate for electronic component inspection apparatus can more reliably yield the effects (1) and (2).

Also, the present invention encompasses a wiring substrate for electronic component inspection apparatus wherein the resin layers of the first laminate are formed of polyimide (claim 6).

The wiring substrate for electronic component inspection apparatus can more reliably yield the effect (1), since the polyimide has a thermal deformation temperature of 343° C.

Additionally, the present invention encompasses a wiring substrate for electronic component inspection apparatus wherein the brazing material layer is formed of gold brazing material or silver brazing material (claim 7).

The wiring substrate for electronic component inspection apparatus can reliably yield the effect (1), since gold brazing material (gold alloy) and silver brazing material (silver alloy) used to form the brazing material layer have a brazing temperature of about 300° C. and about 800° C., respectively.

The gold brazing material is, for example, Au—Sn alloy or Au—Cu alloy, and the silver brazing material is, for example, Ag—Cu alloy or Ag—Cu—Zn alloy.

MODES FOR CARRYING OUT THE INVENTION

Embodiments of the present invention will next be described.

Figure 1:
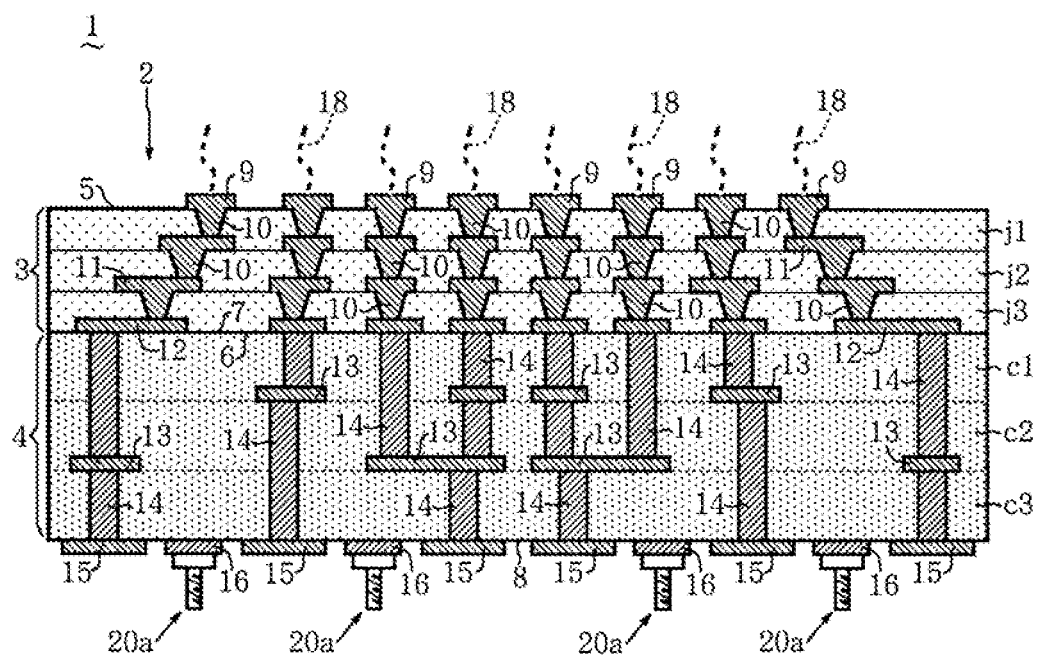
FIG. 1 Vertical sectional view showing a wiring substrate for electronic component inspection apparatus according to an embodiment of the present invention.

FIG. 1 is a vertical sectional view showing a wiring substrate for electronic component inspection apparatus (hereinafter, referred to merely as the wiring substrate) 1 according to an embodiment of the present invention.

As shown in FIG. 1, the wiring substrate 1 includes a substrate body 2. The substrate body 2 is composed of a first laminate 3 which is formed by stacking a plurality (three) of resin layers j1 to j3 and has a front surface 5 and a back surface 6 facing each other, and a second laminate 4 which is disposed on the back surface 6 side of the first laminate 3, is formed by stacking a plurality (three) ceramic layers c1 to c3, and has a front surface 7 and a back surface 8 facing each other.

The plurality of resin layers j1 to j3 of the first laminate 3 are formed of, for example, polyimide (PI) having a thermal deformation temperature of about 343° C. As shown in FIG. 1, a plurality of pads for probe 9 are formed on the front surface 5 of the first laminate 3; inner wiring layers 11 each having a predetermined pattern are formed between the resin layers j1 to j3; the inner wiring layers 11 are connected in an electrically communicating manner through via conductors (filled vias) 10 formed in the resin layers j1 to j3 in such a manner as to individually extend therethrough at predetermined positions. The pads for probe 9, the via conductors 10, and the inner wiring layers 11 contain copper or silver as a main component.

As shown in FIG. 1, the second laminate 4 includes surface wiring layers 12 formed on its front surface 7, inner wiring layers 13 formed between the ceramic layers c1 to c3, a plurality of connection terminals (external connection terminals) 15 formed on its back surface 8, and a plurality of via conductors 14 extending through the ceramic layers c1 to c3 as appropriate and individually establishing connections between the surface wiring layers 12, the inner wiring layers 13, and the connection terminals 15.

The via conductors 10 of the first laminate 3 are connected individually to the surface wiring layers 12. A plurality of metal layers 16 are formed on the back surface 8 at positions located 200 μm or more away from the connection terminals 15.

Notably, the ceramic layers c1 to c3 of the second laminate 4 are formed of, for example, glass-ceramic, which is a type of low-temperature-firing ceramic.

Also, the surface wiring layers 12, the inner wiring layers 13, the connection terminals 15, and the via conductors 14 contain silver or copper as a main component.

Further, the metal layer 16 is formed by sequentially laminating, in a downward (outward) direction from the back surface 8, a thin film layer of titanium formed by sputtering, a thin film layer of copper formed by sputtering, an electroplating film of copper, and an electroplating film of nickel, and the outer side surfaces thereof are coated with a gold film (these films are unillustrated).

As shown in FIG. 1, studs 20a are joined to the surfaces (lower surfaces) of the metal layers 16, respectively. The studs 20a are formed of, for example, Kovar. As shown in the enlarged view of FIG. 2, each stud 20a is composed of a flange portion 21, which is a circular flat plate in plan view, and a bolt portion 24 standing perpendicularly from a central portion of the surface of the flange portion 21 and having an external thread 23 cut in its outer circumferential surface. Notably, the nominal size of the external thread 23 is, for example, M4 or M5.

A brazing material layer 28 having a disk shape is disposed between the surface of the metal layer 16 and a joint surface 22 of the flange portion 21 facing the surface of the metal layer 16. The stud 20a is joined to the metal layer 16 via the brazing material layer 28.

Figure 2:
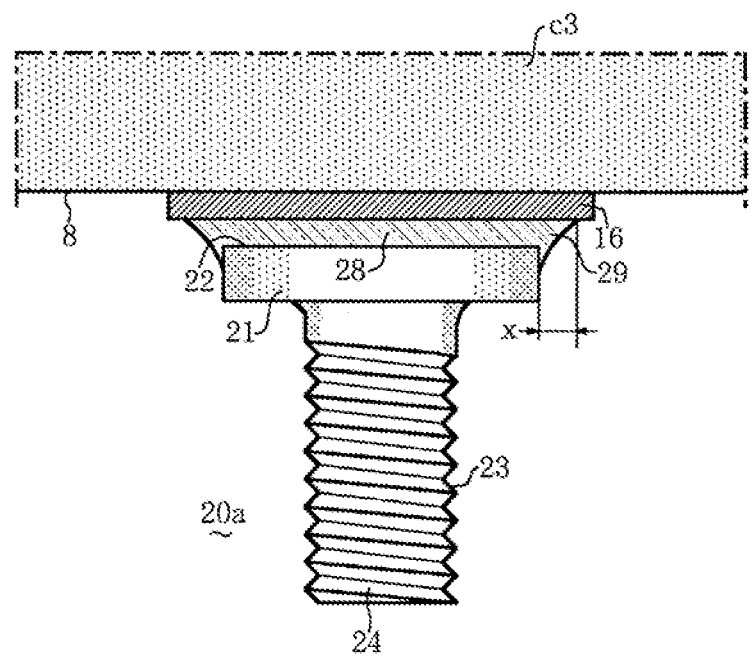
FIG. 2 Enlarged fragmentary view showing a stud and its vicinity in the wiring substrate.

As shown in FIG. 2, the brazing material layer 28 has an extension portion 29 located within a range of a distance (x) between the outermost portion thereof and the peripheral edge of the joint surface 22 of the flange portion 21, and the length x of the distance is 50 μm or less in plan view. The extension portion 29 has a fillet-shaped cross section as a result of solidification of the brazing material after oozing and wetting along an outer circumferential surface of the flange portion 21.

The studs 20a were brazed (joined) to the surfaces of the metal layers 16, respectively, as follows, for example.

Figure 3:
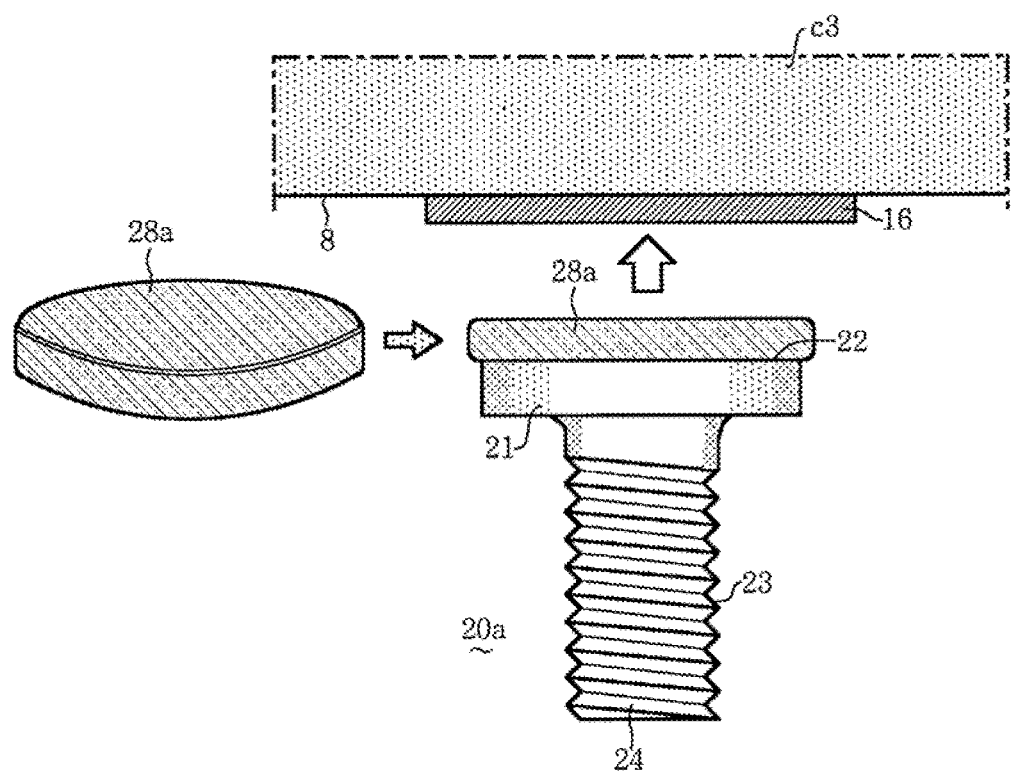
FIG. 3 Schematic view showing a method of brazing the stud.

As shown in FIG. 3, circular blanks slightly greater than the external shape of the flange portion 21 in plan view were stamped out from, for example, a brazing material sheet (not shown) of Au—Sn alloy to prepare disk-shaped preforms 28a beforehand.

Next, as indicated by the horizontal arrow in FIG. 3, the preforms 28a were placed on the joint surfaces 22 of the flange portions 21, respectively. Then, as indicated by the upward arrow in FIG. 3, the studs 20a having the preforms 28a placed thereon were brought under pressure into contact with the surfaces of the metal layers 16, respectively. Further, under such conditions, the wiring substrate 1 was inserted into a heating furnace (not shown); then, the furnace was raised in temperature to near the melting point of the preforms 28a and maintained at the temperature for a predetermined time.

In the above heating process, the resin layers j1 to j3 of the first laminate 3 were free from softening and melting, and deformation associated therewith, since the resin layers j1 to j3 were formed of polyimide as mentioned above.

As a result, there was obtained the brazing material layer 28 which had the extension portion 29 on its outermost side in plan view as shown in FIG. 2 and in which the length x of protrusion of the extension portion 29 from the outermost portion of the flange portion 21 was restrained to 50 μm or less, and the stud 20a was able to be firmly brazed (joined), via the brazing material layer 28, to the surface of the metal layer 16 provided beforehand on the back surface 8 of the second laminate 4. Further, the plurality of the studs 20a were joined in such a manner that the standard deviation σ indicative of variation of the lengths x of the extension portions 29 was adjusted to 30 μm or less.

It is easily understood that the above-described wiring substrate 1 yields the aforementioned effects (1) to (3).

EXAMPLES

There were prepared two wiring substrates 1 having the same shape, the same structure, and the same dimensions. The two wiring substrates 1 had twenty metal layers 16 each formed on the back surfaces 8 of their second laminates 4, and the metal layers 16 were formed of the same material at the same positions and had the same shape and the same dimensions.

One of the two wiring substrates 1 was taken as an example; the preforms 28a 0.3 μm to 3 μm greater in diameter than the flange portions 21 of the studs 20a were placed on the joint surfaces 22 of the flange portions 21, respectively; the studs 20a with the preforms 28a were brought under pressure into contact with the surfaces of the metal layers 16, respectively, of the wiring substrate 1; and under such conditions, brazing was performed within a heating furnace.

The thus-obtained twenty brazing material layers 28 were individually measured for the maximum length x of the extension portion 29 protruding from the peripheral edge of the flange portion 21. As a result of calculation of the standard deviation σ of all of the measured lengths x, the deviation σ was 23 μm.

The other wiring substrate 1 was taken as a comparative example; resin films were placed on the joint surfaces 22 of the flange portions 21 of the studs 20a, respectively, by dropping molten acrylic resin in the same amount on the joint surfaces 22 by a dispenser; the studs 20a with the resin films were brought under pressure into contact with the surfaces of the metal layers 16, respectively, of the wiring substrate 1; and under such conditions, the wiring substrate 1 was allowed to stand until the acrylic resin solidified.

The thus-obtained twenty bonding layers of acrylic resin were measured for the maximum length x of an extension portion protruding from the peripheral edge of the flange portion 21. As a result of calculation of the standard deviation σ of all of the measured lengths x, the deviation σ was 992 μm.

The example and the comparative example have supported the fact that the wiring substrate 1 according to the present invention yields the aforementioned effect (2).

Figure 4:
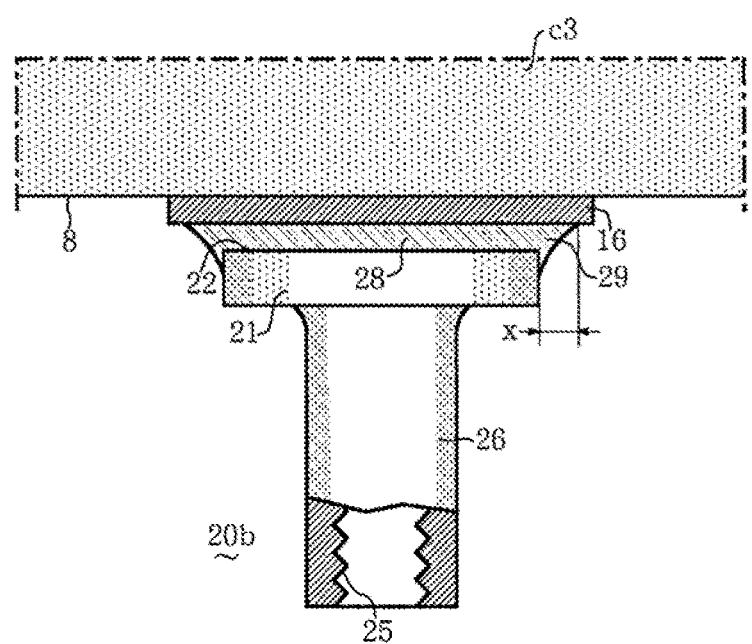
FIG. 4 Enlarged fragmentary view showing a stud according to a different embodiment and its vicinity.

FIG. 4 is an enlarged view showing a stud 20b according to a different embodiment.

The stud 20b is formed of, for example, Kovar and includes, as shown in FIG. 4, the flange portion 21 and a nut tube portion 26 having a cylindrical shape and standing perpendicularly from a central portion of the surface of the flange portion 21. The nut tube portion 26 coaxially has an internally threaded hole such that an internal thread 25 having a nominal size of M4 or M5 is cut in an inner circumferential surface of the hole.

A bolt standing from an unillustrated inspection apparatus enters the internal thread 26 of the nut tube portion 26 in a threadingly engaging manner. Accordingly, the posture of the wiring substrate 1 having a plurality of the studs 20b joined to the back surface 8 of the second laminate 4 can be adjusted optimally for inspection.

The wiring substrate 1 which has the studs 20b having the nut tube portions 26, respectively, can also yields the aforementioned effects (1) to (3).

The present invention is not limited to the above-described embodiments and example.

For example, the number of the resin layers jn of the first laminate 3 may be two or four or more, and a resin material used to form the resin layers jn is not limited to the aforementioned polyimide, but another resin material may be used so long as the resin material has a thermal deformation temperature of 300° C. or higher.

Also, the number of the ceramic layers cn of the second laminate 4 may be two or four or more, and a high-temperature-firing ceramic, such as alumina, mullite, or aluminum nitride, may be used to form the ceramic layers cn. In the case of use of the high-temperature-firing ceramic, an electrically conductive material used to form the wiring layers 12 and 13, the via conductors 14, and the connection terminals 15 is tungsten or molybdenum.

Further, the studs 20a and 20b may be formed of any one of 42 alloy, 194 alloy, and various types of stainless steel.

Also, the flange portions of the studs 20a and 20b may have the shape of a regular polygon equal to or greater than a regular hexagon in terms of number of sides in plan view. In this case, the preform having a shape similar to the regular polygon in plan view is used.

Further, the external thread 23 and the internal thread 25 of the studs 20a and 20b may have a nominal size other than M4 and M5.

Additionally, a gold brazing material other than the aforementioned Au—Sn alloy, or a silver brazing material may be used to form the brazing material layer 28.

INDUSTRIAL APPLICABILITY

The present invention can reliably provide a wiring substrate for electronic component inspection apparatus which includes a first laminate of resin layers with a plurality of pads for probe provided on its front surface and a second laminate of ceramic layers disposed on the back side of the first laminate; which, despite joining by brazing of a plurality of studs to the back surface of the second laminate, is free from deformation of resin of the first laminate caused by softening or the like and from accidental formation of a short circuit between brazing material layers used for the brazing and external connection terminals formed on the back surface of the second laminate; and which is less susceptible to disconnection from an external device, which could otherwise result from covering of the external connection terminal(s) by a resin adhesive.

DESCRIPTION OF SYMBOLS

1: wiring substrate for electronic component inspection apparatus
3: first laminate
4: second laminate
5: front surface
6, 8: back surface
9: pad for probe
16: metal layer
20a, 20b: stud
21: flange portion
22: joint surface
24: bolt portion
26: nut tube portion
28: brazing material layer
29: extension portion
j1 to j3: resin layer
c1 to c3: ceramic layer
x: length

What is claimed is:

1. A wiring substrate for electronic component inspection apparatus comprising:
   a first laminate which is composed of a plurality of stacked resin layers and which has a plurality of pads for probe on its front surface;
   a second laminate which is disposed on a back surface side of the first laminate and which is composed of a plurality of stacked ceramic layers; and
   a plurality of studs joined to a back surface of the second laminate;
   the wiring substrate for electronic component inspection apparatus being characterized in that
   the resin layers of the first laminate are formed of a resin having a thermal deformation temperature of 300° C. or higher, and
   the stud is joined via a brazing material layer to a surface of a metal layer formed on the back surface of the second laminate.

2. A wiring substrate for electronic component inspection apparatus according to claim 1, wherein
   the brazing material layer has an extension portion located, in plan view, within a range of a distance between an outermost portion of the brazing material layer and a peripheral edge of a joint surface of the stud, and
   a length of the extension portion is 50 μm or less in the plan view.

3. A wiring substrate for electronic component inspection apparatus according to claim 2, wherein
- a plurality of the brazing material layers used for joining of the plurality of studs have the extension portions, respectively, and
- a standard deviation σ indicative of the amount of variation of the extension portions in the plan view is 30 μm or less.

4. A wiring substrate for electronic component inspection apparatus according to claim 1, wherein the stud comprises a flange portion having the joint surface facing the metal layer, and a bolt portion standing perpendicularly from a surface of the flange portion, or a nut tube portion standing perpendicularly from the surface of the flange portion.

5. A wiring substrate for electronic component inspection apparatus according to claim 1, wherein the stud is joined such that a flange portion of the stud is joined to the surface of the metal layer formed on the back surface of the second laminate via the brazing material layer.

6. A wiring substrate for electronic component inspection apparatus according to claim 1, wherein the resin layers of the first laminate are formed of polyimide.

7. A wiring substrate for electronic component inspection apparatus according to claim 1, wherein the brazing material layer is formed of gold brazing material or silver brazing material.

* * * * *